United States Patent [19]

Weigand

[11] Patent Number: 5,374,966
[45] Date of Patent: Dec. 20, 1994

[54] LOW NOISE IMPEDANCE-MATCHED VIDEO AMPLIFIER

[75] Inventor: Benjamin F. Weigand, Ellicott City, Md.

[73] Assignee: Westinghouse Electric Corporation, Pittsburgh, Pa.

[21] Appl. No.: 46,321

[22] Filed: Apr. 15, 1993

[51] Int. Cl.$^5$ ............................................. H04N 5/14
[52] U.S. Cl. ................................. 348/707; 330/98; 330/104; 330/124 R; 330/293
[58] Field of Search ................. 358/184; 330/98, 103, 330/104, 105, 124 R, 282, 291, 292, 293; 348/707

[56] References Cited

U.S. PATENT DOCUMENTS

| | | | |
|---|---|---|---|
| 3,299,367 | 1/1967 | Howden | 330/104 |
| 3,538,445 | 11/1970 | Brennen | 330/103 |
| 3,713,031 | 1/1973 | Williams et al. | 330/103 X |
| 4,091,333 | 5/1978 | Thrap | 330/104 X |
| 4,292,468 | 9/1981 | Yokoyama | 330/103 X |
| 4,577,160 | 3/1986 | Lettvin et al. | 330/293 X |
| 4,786,878 | 11/1988 | Botti | 330/124 R X |
| 5,227,735 | 7/1993 | Lumsden | 330/124 R X |

Primary Examiner—Mark R. Powell
Assistant Examiner—John W. Miller

[57] ABSTRACT

A video amplifier having a reduced noise figure is realized by eliminating the need for a resistive matching termination at the input of the amplifier. A negative feedback loop reduces the effective input impedance of the amplifier by generating an active impedance at the input of the amplifier. Because the input impedance of the amplifier is actively matched to the output impedance of the video signal generator, a noise-generating resistive termination is unnecessary, and the noise figure of the overall impedance-matched amplifier is significantly reduced.

14 Claims, 6 Drawing Sheets

LOW NOISE IMPEDANCE-MATCHED VIDEO AMPLIFIER

BACKGROUND OF THE INVENTION

The present invention relates to video amplifiers and, more particularly, to an active impedance-matched video amplifier.

DISCUSSION OF RELATED ART

A video receiver includes a video amplifier connected between a video signal mixer and an analog-to-digital converter. In order to achieve good linearity and freedom from distortion, the input signals applied to the mixer are maintained at a relatively low level. Due to the low level of the input signals, however, the video amplifier must have an acceptable noise figure to prevent degradation of overall system sensitivity.

A matching impedance is frequently used to terminate the output of the video signal mixer at the input of the video amplifier to maintain a flat frequency response, maximizing power transfer. If the video amplifier is required to handle signal frequencies down to dc, the matching impedance looking into the amplifier cannot be ac-coupled via a transformer. Thus, when the video amplifier employs an operational amplifier, the use of a real resistance is necessary to provide the matching termination. The resistive termination is required whether the device operates as a voltage amplifier, in which the matching impedance is shunted across a high-impedance input, or as a current-to-voltage, transimpedance amplifier, in which the matching impedance is connected to drive into a virtual ground.

Because the resistive termination dissipates virtually all of the power at the input, it effectively acts as an attenuator preceding the operational amplifier. As a result, the noise performance of the conventional impedance-matched video amplifier, when configured as an operational amplifier with a resistive matching load, is limited by the resistive termination at the input to the operational amplifier.

Even if the operational amplifier is assumed to be noiseless, the noise contribution of the matching resistor results in a minimum effective noise figure of 3 dB. Therefore, in a practical device, the noise contributions of the operational amplifier and associated feedback resistors add to the 3 dB noise produced by the resistive termination. For example, the minimum noise figure for commercially available devices is typically 11 or 12 dB, which may be excessive for a given application. Accordingly, to improve noise performance, an alternative to the resistive matching termination used in conventional video amplifier circuits is desirable.

SUMMARY OF THE INVENTION

The object of the present invention is to provide an active impedance-matched video amplifier having a reduced noise figure.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the written description and claims, as well as the appended drawings.

To achieve the objects and in accordance with the purpose of the invention, as embodied and broadly described herein, the present invention is a low noise active impedance-matched video amplifier comprising a video signal generator, an amplifier including a first input coupled to an output of the video signal generator, the amplifier having an input impedance greater than an output impedance of the video signal generator, first feedback means, coupled between an output and a second input of the amplifier, for reducing the open-loop gain of the amplifier, and second feedback means, coupled between the output and the first input of the amplifier, for reducing an effective input impedance of the amplifier to a value substantially equivalent to the value of the output impedance of the video signal generator.

It is to be understood that both the foregoing general description and the following detailed description are exemplary and explanatory only and are not restrictive of the invention, as claimed.

The accompanying drawings, which are incorporated in and constitute a part of this specification, illustrate various embodiments of the invention and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 3:
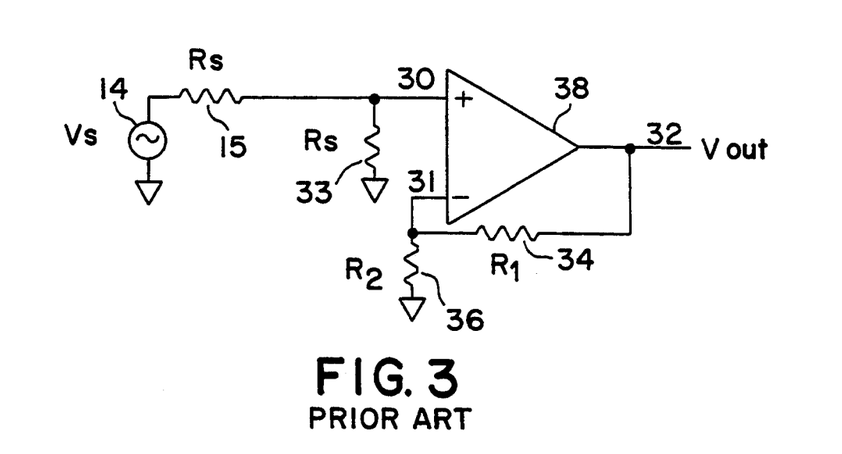
FIG. 3 is an example of a conventional resistively matched voltage amplifier used for video amplification.

In conventional video amplifiers, the output of the video signal mixer is typically terminated in a matching resistance at the input of the video amplifier to ensure a flat frequency response so that power transfer can be maximized. For example, FIG. 3 illustrates a conventional resistively-matched voltage amplifier configuration. As shown, video signal generator 14 produces a video signal Vs that drives the non-inverting input 30 of operational amplifier 38 through an output impedance 15, typically having a value Rs of 50Ω for video applications.

Resistor 34, having a value R1, connects the inverting input 31 of amplifier 38 and the amplifier output 32, and resistor 36, of value R2, is connected between the inverting input 31 and the ground potential. Resistor 33, connected between non-inverting input 30 and the ground potential and having a value Rs, provides a matching termination for the output impedance 15. Resistors 34 and 36 define a closed loop amplifier gain from input 30 to output 32 of A1=1+R1/R2. However, the source to output gain Vs/Vout is effectively reduced to A1/2 because the resistive termination acts to divide the video signal Vs seen at input 30 down to Vs×Rs/2Rs, or Vs/2.

Figure 5:
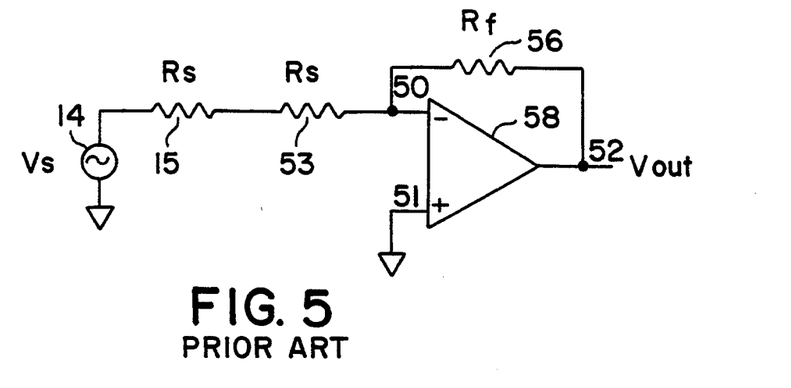
FIG. 5 is an example of a conventional resistively matched transimpedance amplifier used for video amplification.

FIG. 5 shows a conventional resistively matched transimpedance video amplifier. Video signal generator 14 drives the inverting input 50 of operational amplifier 58 through the output impedance 15. The non-inverting input 51 of amplifier 58 is grounded, and a feedback resistor 56, having a value Rf, couples the output 52 to the inverting input 50. For this circuit, the matching impedance is provided by connecting resistor 53 in series between output impedance 15 and inverting input 50. The closed loop gain of amplifier 58, as defined by feedback resistor 56 and series resistor 53, is A2=−Rf/Rs. To produce the same source to output (Vs to Vout) gain A1/2 as that of the voltage amplifier shown in FIG. 3, the value Rf of feedback resistor 56 must be equal to A1×Rs, where A1=1+R1/R2.

In the conventional video amplifiers shown in FIG. 3 and FIG. 5, the output impedance 15 of the video signal generator 14 is matched by a resistor 33, 53, respectively. However, the resistive matching load acts as an attenuator at the input of the video amplifier, degrading the amplifier noise performance. High frequency circuits that do not operate at dc avoid the loss resulting from resistive matching by transformer coupling the video signal Vs such that the power is transferred into the amplifier, and not into the matching load. Transformer coupling is not an option if dc operation is required.

The present invention is an active impedance-matched video amplifier that eliminates tile need for the resistive matching termination used in conventional video amplifiers. A video amplifier constructed according to the present invention transforms the impedance looking into the amplifier by the use of gain and feedback to provide an active rather than actual impedance match.

Using an amplifier having a stable, relatively finite gain, compared to the typical open loop gain of an operational amplifier, the input impedance of the overall amplifier circuit can be transformed via a feedback loop from an extremely high value to a low, non-zero value. The elimination of the noise-producing resistive matching load used in conventional impedance-matched video amplifiers results in a substantial improvement in noise performance.

Figure 1:
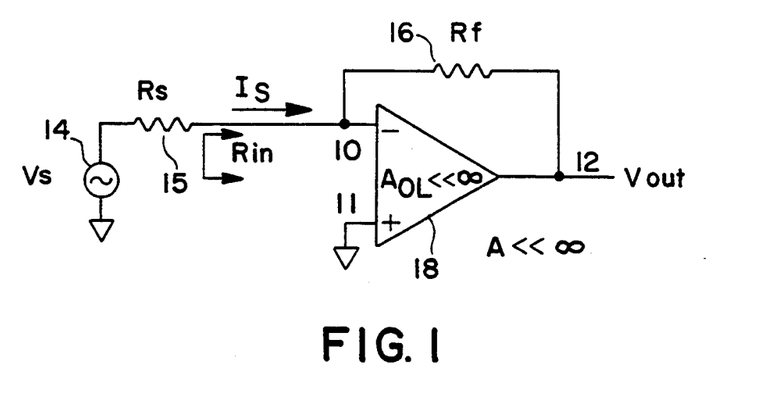
FIG. 1 is a circuit diagram illustrating one embodiment of an active impedance-matched video amplifier in accordance with the present invention.

FIG. 1 illustrates one embodiment of the active impedance-matched video amplifier of the present invention. The video amplifier shown in FIG. 1 includes a video signal generator 14 having an output impedance 15 coupled to the inverting input 10 of amplifier 18. A feedback resistor 16, having a value of Rf, connects the output 12 of amplifier 18 to the inverting input 10. The non-inverting input 11 is connected to the ground potential.

According to the present invention, amplifier 18 requires a finite open loop gain $A_{OL}=A$, relative to the open loop gain of an operational amplifier. The relatively finite open loop gain A enables feedback resistor 16 to transform the effective input impedance at inverting input 10 to a value Rin substantially equivalent to the impedance Rs of output resistor 15.

The input impedance of amplifier 18 can be calculated as the ratio of the input signal voltage at inverting input 10 to the input signal current Is. In the video amplifier shown in FIG. 1, the effective input impedance Rin of amplifier 18 is actively controlled as a function of the value Rf of the feedback resistor 16 and the open loop gain A of amplifier 18. Specifically, when amplifier 18 has a finite open loop gain A, as required, the effective input impedance Rin of amplifier 18 is:

$$Rin = \frac{Vs}{Is} = \frac{Rf}{1+A}. \qquad (1)$$

Thus, the closed loop gain of the circuit is:

$$Gain = \frac{Vo}{Vs} = -\frac{Rf}{Rs}\left(\frac{1}{\frac{1}{A}\left(\frac{Rf}{Rs}+1\right)+1}\right). \qquad (2)$$

If the open loop gain A were very high, as is the case for the open loop gain in an operational amplifier, the value of the input impedance Rin would approach zero and the closed loop gain of amplifier 18 would approach −Rf/Rs as a function of the values of feedback resistor 16 and output impedance 15.

In the active impedance-matched video amplifier of FIG. 1, however, if the open-loop gain A of amplifier 18 is a relatively finite value such as 19, for example, and the value Rf of feedback resistor 16 is selected to be 1kΩ, then, from equation (1), the input impedance Rin is 50Ω, and the closed loop gain of amplifier 18 becomes −A/2−9.5. Thus, in this example, the magnitude of the closed loop gain of amplifier 18 is the same as the source to output gain of the voltage amplifier shown in FIG. 3, assuming A1=1+R1/R2=19. However, because resistive impedance matching is not employed, there is no resistive loss at the input of amplifier 18, resulting in a significant improvement in noise performance.

Figure 2:
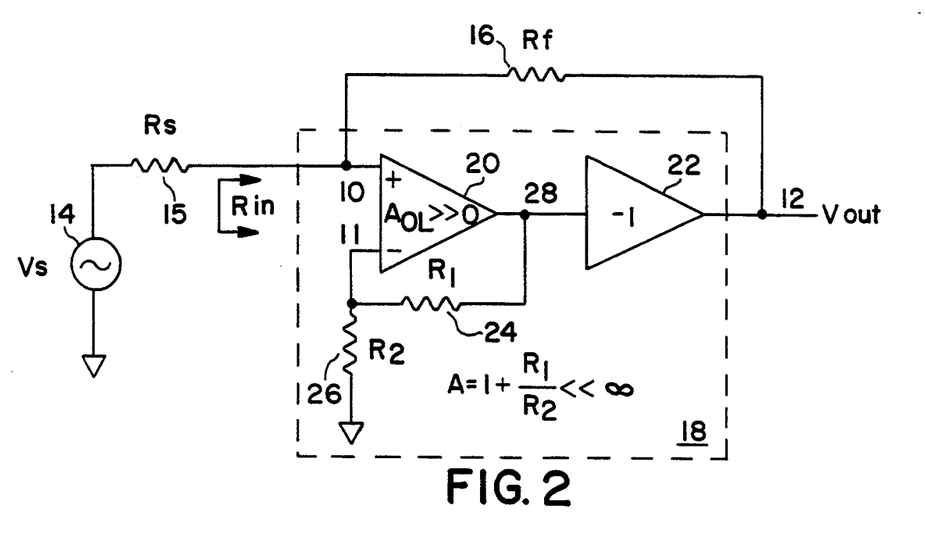
FIG. 2 is a circuit diagram of another embodiment of the active impedance-matched video amplifier of the present invention.

FIG. 2 shows another embodiment of the active impedance-matched video amplifier of the present invention. In this embodiment, amplifier 18 is realized by a non-inverting operational amplifier 20 and an inverter 22. Operational amplifier 20 has a very high open loop gain $A_{OL}$, but is configured to have a finite stage gain A. Resistor 26, connecting the non-inverting input 11 of amplifier 20 to the ground potential, and resistor 24, coupled between the output 28 and input 11, reduce the open loop gain $A_{OL}$ of operational amplifier 20 to the relatively finite stage gain A. Thus, operational amplifier 20 generates a stage gain of $A = 1 + R_1/R_2$, according to the values of resistors 24 and 26, and provides a high input impedance to prevent loading of the active input impedance at non-inverting input 10.

As shown in FIG. 2, the signal generator 14 applies the video signal Vs to the non-inverting input 10 of operational amplifier 20 through the output impedance 15. The video signal Vs is amplified by the stage gain A of operational amplifier 20, and is then inverted by a unity gain inverter 22, having an input connected to the output 28 of operational amplifier 20. Inverter 22 provides the phase reversal necessary to form a negative feedback loop via feedback resistor 16, connected between output 12 of inverter 22 and the non-inverting input 10 of amplifier 20.

To actively match the effective input impedance of amplifier 18 to the value Rs of the output impedance 15, according to the present invention, the value Rf of the feedback resistor 16 is selected to be approximately equal to $(A+1) \times Rs$, as indicated in equation (1). From equation (2), the resulting closed loop gain is then A/2. Thus, if maintained within the range of useful gain of operational amplifier 20, stage gain A can be defined by resistors 24 and 26 to correspond to twice the value of any desired gain.

Although the incorporation of inverter 22 into the circuit may result in the generation of additional noise, the gain A of the preceding amplifier stage associated with amplifier 20 generally can be set high enough to dominate any noise effects produced by the inverter 22. Therefore, as a practical matter, the noise contribution of inverter 22 can be ignored when analyzing the noise performance of the video amplifier of the present invention.

The advantages of the active impedance-matched video amplifier of the present invention, relative to the conventional resistively matched video amplifiers, can be appreciated by comparing the noise figures of the circuits. Thus, the following is an analysis of the noise performance of the conventional video amplifiers shown in FIG. 3 and FIG. 5 in comparison with that of the present invention.

Figure 4:
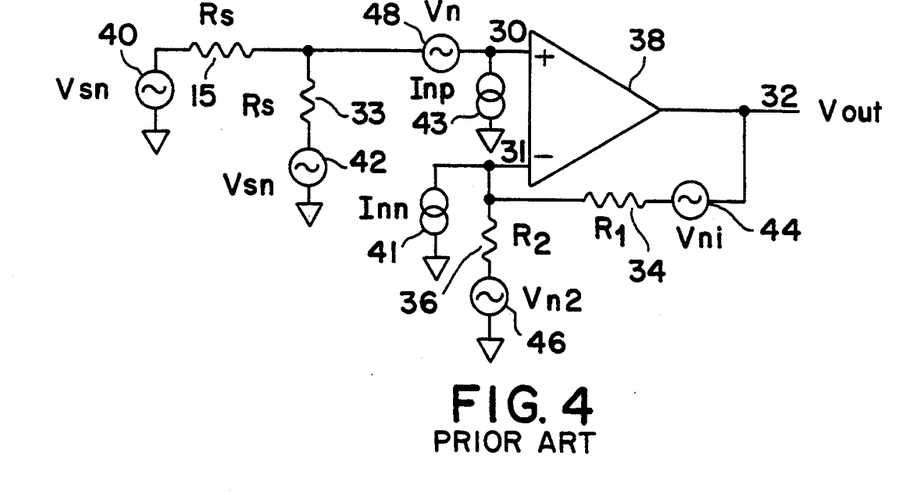
FIG. 4 is a circuit noise model for the conventional voltage amplifier shown in FIG. 3.

The noise figures of the video amplifiers of FIG. 3 and FIG. 5 can be calculated by comparing the noise generated at the output of the actual amplifiers to the noise generated at the output of an ideal noiseless amplifier. FIG. 4 shows a circuit noise model for the voltage amplifier of FIG. 3. For this analysis, amplifier noise is modeled as a current noise source at each input of the amplifier, and as voltage noise at the non-inverting input. Resistor noise is modeled as voltage noise in series with the respective resistor.

In the circuit noise model of FIG. 4, corresponding to the voltage amplifier shown in FIG. 3, two voltage sources 40 and 42, both producing a noise signal Vsn, represent the noise voltages associated with the output impedance 15 and the matching resistor 33, respectively. Voltage source 44 represents the noise voltage Vn1 of resistor 34, and voltage source 46 represents the noise voltage Vn2 for resistor 36. Voltage source 48 corresponds to the voltage noise Vn generated by amplifier 38, current source 43 models the positive-input current noise Inp of amplifier 38, and current source 41 represents the negative-input current noise Inn of amplifier 38. Superposition is used to compute the contribution Vout of each noise source at the output 32, as follows:

For the voltage noise Vsn of output impedance 15:

$Vout = \frac{1}{2}(1 + R1/R2) \times Vsn.$

For the voltage noise Vsn of matching resistor 33:

$Vout = \frac{1}{2}(1 + R1/R2) \times Vsn.$

For the voltage noise Vn of amplifier 38:

$Vout = 1 + R1/R2 \times Vn.$

For the non-inverting input current noise Inp of amplifier 38:

$Vout = 1 + R1/R2 \times Rs/2 \times Inp.$

For the inverting input current noise Inn of amplifier 38:

$Vout = R1 \times Inn.$

For the voltage noise Vn2 of resistor 36:

$Vout = R1/R2 = Vn2.$

For the voltage noise Vn1 of resistor 34:

$Vout = Vn1.$

Summing the output power due to all noise sources, the noise output power Nout is:

$$Nout = \left[\left(\frac{1}{2} Vsn\right)\left(1 + \frac{R1}{R2}\right)\right]^2 +$$

$$\left[\left(\frac{1}{2} Vsn\right)\left(1 + \frac{R1}{R2}\right)\right]^2 + \left[Vn\left(1 + \frac{R1}{R2}\right)\right]^2 +$$

$$\left[Inp\left(\frac{Rs}{2}\right)\left(1 + \frac{R1}{R2}\right)\right]^2 + [Inn(R1)]^2 +$$

$$\left[Vn2\left(\frac{R1}{R2}\right)\right]^2 + [Vn1]^2.$$

To compute the noise factor for the voltage amplifier shown in FIG. 3, the output noise power obtained above is compared to the noise power at the output of an ideal noiseless amplifier having the same gain. The ideal noiseless amplifier is assumed to have a noiseless matching resistor Rs and provide a gain of $A = 1 + R1/R2$. The output impedance of the signal generator provides the only noise source for this circuit, and is represented in the following noise expressions by the noise signal Vsn. The noise figure is defined as 10 log (F) where F is the noise factor. The noise factor is:

$$F = \frac{\text{Signal-to-noise at the input}}{\text{Signal-to-noise at the output}} \quad (3)$$

$$= \frac{\text{Actual noise at the output}}{\text{Noise at output of noiseless amp with same gain}}.$$

The reference output noise Noutref of the "noiseless" amplifier is $$N\text{outref} = \left[\frac{1}{2}(Vsn)\left(1 + \frac{R1}{R2}\right)\right]^2.$$

Using equation (3), the noise factor F for the voltage amplifier shown in FIG. 3 is:

$$F = \frac{N\text{out}}{N\text{outref}} = 2 + \left[2\left(\frac{Vn}{Vsn}\right)\right]^2 + \left[\frac{Inp\, Rs}{Vsn}\right]^2 + \qquad (4)$$

$$\left[\left(\frac{2}{A}\right)\left(\frac{Inn\, R1}{Vsn}\right)\right]^2 + \left[\left(\frac{2(A-1)}{A}\right)\left(\frac{Vn2}{Vsn}\right)\right]^2 +$$

$$\left[\left(\frac{2}{A}\right)\left(\frac{Vn1}{Vsn}\right)\right]^2,$$

where $A = 1 + \frac{R1}{R2}$.

Figure 6:
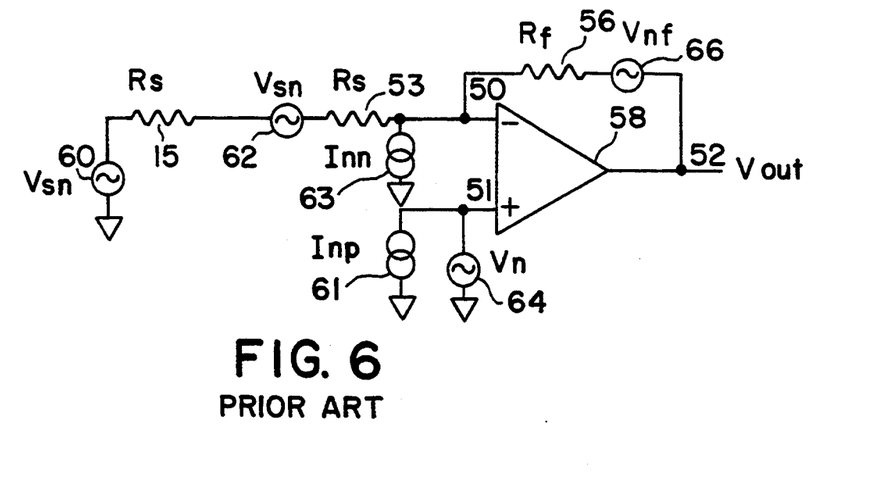
FIG. 6 is a circuit noise model for the conventional transimpedance amplifier shown in FIG. 5.

FIG. 6 is a circuit noise model for the conventional transimpedance video amplifier shown in FIG. 5. Voltage sources and 62 both generate a noise signal Vsn representing the noise produced by output impedance 15 and series matching resistor 53, respectively. Voltage source 66 models the prospective noise contribution Vnf of feedback resistor 56. Voltage source 64 represents the input voltage noise Vn of amplifier 58, current source 61 provides the positive-input current noise Inp of amplifier 58, and current source 63 represents the negative-input current noise Inn generated by amplifier 58. As before, the contribution of each noise source can be obtained by superposition and added as uncorrelated powers, as follows:

For the voltage noise Vsn of output impedance 15:

$$V\text{out} = Vsn \times \frac{Rf}{2Rs}.$$

For the voltage noise Vsn of matching resistor 53:

$$V\text{out} = Vsn \times \frac{Rf}{2Rs}.$$

For the voltage noise Vn of amplifier 58:

$$V\text{out} = Vn \times \left(1 + \frac{Rf}{2Rs}\right).$$

For the non-inverting input current noise Inp of amplifier 58:

Vout=0.

For the inverting input current noise Inn of amplifier 58:

$V\text{out} = Inn \times Rf.$

For the voltage noise of feedback resistor 56:

Vout=Vnf.

To maintain the same gain magnitude as in the non-inverting voltage amplifier shown in FIG. 3, the gain is $$|\text{Gain}| = \frac{A}{2} = \frac{Rf}{2Rs}$$

where $A = \frac{Rf}{Rs}$.

Accordingly, the output noise and noise factor for the circuit shown in FIG. 5 are respectively:

$$N\text{out} = 2\left(Vsn\frac{1}{2}A\right)^2 + (Vnf)^2 + (Inn\, A\, Rs)^2 + \qquad (5)$$

$$\left[Vn\left(1 + \frac{ARs}{2Rs}\right)\right]^2,$$

and $$F = \frac{N\text{out}}{N\text{outref}} = 2 + \left[\left(\frac{2}{A}\right)\left(\frac{Vnf}{Vsn}\right)\right]^2 +$$

$$\left[2\left(\frac{Inn\, Rs}{Vsn}\right)\right]^2 + \left[\left(\frac{2+A}{A}\right)\left(\frac{Vn}{Vsn}\right)\right]^2.$$

As demonstrated by expressions (4) and (5) above, the noise figure for each of the conventional resistively matched video amplifiers shown in FIG. 3 and FIG. 5 includes a "2" term due to the noise output of the matching resistors. With the "2" term in each of the above expressions, however, the absolute minimum noise figure for the video amplifiers of FIG. 3 and FIG. 5 is 10 Log 2=3 dB. For instance, even if all other noise sources in the circuits are zero, the noise figure can be no better than 3 dB due to the attenuation resulting when the amplifier input is resistively matched with the output impedance 15 of the signal generator 14.

Figure 7:
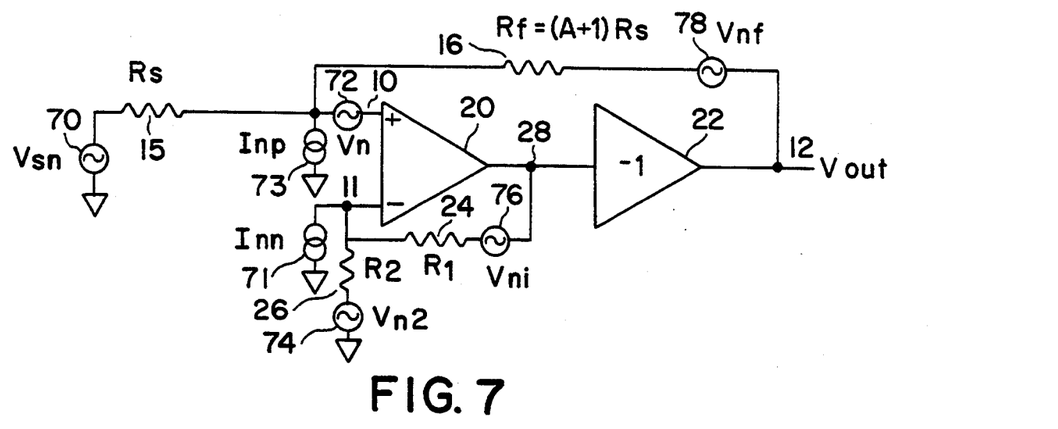
FIG. 7 is a circuit noise model for the active impedance-matched video amplifier shown in FIG. 2.

FIG. 7 is a circuit noise model for the active impedance-matched video amplifier shown in FIG. 2, for comparison of the noise performance of the active impedance-matched video amplifier to that of the conventional video amplifiers. In FIG. 7, voltage source 70 represents the noise voltage generated by the output impedance 15, voltage source 78 is the noise voltage Vnf associated with feedback resistor 16, and voltage source 72 models the input voltage noise Vn of operational amplifier 20. Current sources 71 and 73 represent the negative-input current noise Inn and the positive-input current noise Inp, respectively, of operational amplifier 20. Voltage source 74 is the noise voltage Vn2 of resistor 26 and voltage source 76 represents the noise voltage Vn1 associated with resistor 24. The noise factor for the active impedance-matched circuit can be derived by superposition, as follows:

For the voltage noise Vn2 of resistor 26:

The potential V1 at non-inverting input 10 can be assumed to be equal to the potential V2 at the inverting input 11. Therefore, $V1 = V2,$ $V1 = V\text{out}\left(\frac{Rs}{Rf + Rs}\right) = V\text{out}\left(\frac{1}{A+2}\right),$ and -continued $$\frac{Vn2 - V2}{R2} = \frac{V2 - (-Vout)}{R1} = \frac{V2 + Vout}{R1}.$$

Substituting V1 for V2, an expression for Vout in terms of Vn2 be reduced to:

$$Vout = \frac{Vn2}{2} \left( \frac{(A + 2)(A + 1)}{A + 1} \right),$$

where $A = 1 + R1/R2$.

For the inverting input current noise Inn of amplifier 20:

Current noise source 71 and resistor 26 can be replaced by a Thevenin equivalent voltage Vth, having a value of Inn×R2, and a series resistance R2. From the expression derived for Vn2 above, $$Vout = Vth \left( \frac{1}{2} \left( \frac{(A + 2)(A - 1)}{A + 1} \right) \right) =$$

$$Inn\, R2 \left( \frac{1}{2} \right) \left( \frac{(A + 2)(A - 1)}{A + 1} \right).$$

For the voltage noise Vn1 of resistor 24:

$$(-Vout - Vn1) \frac{R1}{R1 + R2} =$$

$$Vout \left( \frac{Rs}{Rs + Rf} \right) = Vout \left( \frac{1}{A + 2} \right),$$

and solving for Vout, with $A = 1 + R1/R2$, $$Vout = -Vn1 \left( \frac{1}{2} \right) \left( \frac{A + 2}{A + 1} \right).$$

Figure 8:
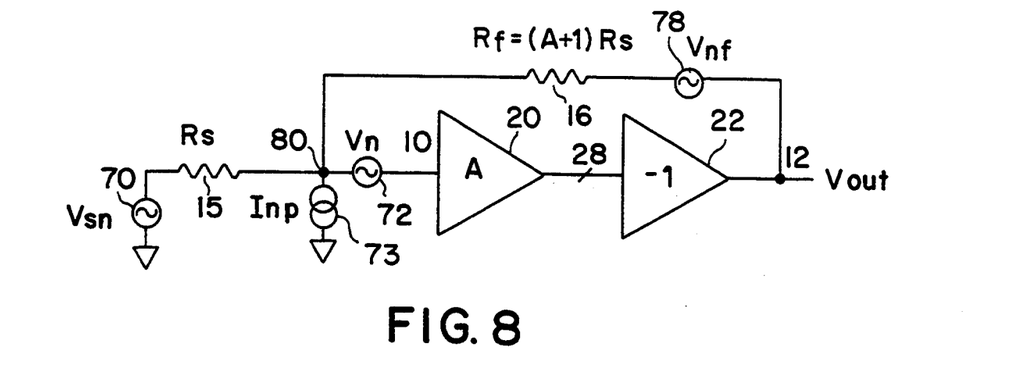
FIG. 8 is a simplified circuit diagram of the circuit noise model of FIG. 7 for noise analysis by superposition.

For the voltage noise Vnf of feedback resistor 16:

Because the noise contributions of the current noise source 71 and voltage noise sources 74 and 76 at the inverting input 11 of operational amplifier 20 have already been calculated above, the circuit of FIG. 7 can be simplified to that shown in FIG. 8. Eliminating the noise sources at the inverting input 11, amplifier 20 is represented in FIG. 8 by a single input 10 and a non-inverting stage gain of A. By superposition, the contribution Vnf of feedback resistor 16, represented by voltage noise source 78, can be calculated with voltage noise source 70 and current noise source 73 set to zero. Thus, representing the potential at input 10 as V1, the noise contribution of the feedback resistor 16 is as follows:

$$V1 = \frac{Rs(Vout - Vnf)}{Rs(A + 1) + Rs};$$

$$-Vout = A \times V1;$$

$$V1 = \frac{Vout}{A}.$$

Substituting to eliminate V1, and solving for Vout as a function of Vsn yields an output noise voltage of:

$$Vout = Vnf \left( \frac{1}{2} \right) \left( \frac{A}{A + 1} \right).$$

For the voltage noise Vn of amplifier 20:

Representing the potential at node 80 of FIG. 8 as V3, the contribution of the amplifier voltage noise Vn at the output Vout is derived as follows:

$$Vn = V1 - V3,$$

$$V3 = -\frac{Vout}{A},$$

$$V1 = Vout \left( \frac{Rs}{Rs + Rf} \right) = Vout \left( \frac{1}{A + 2} \right), \text{ and}$$

$$Vout = Vn \left( \frac{1}{2} \right) \left( \frac{(A + 2)A}{A + 1} \right).$$

For the voltage noise Vsn of output impedance 15:

From the expression for the gain of amplifier 18, $$\frac{Vout}{Vsn} = -\frac{Rf}{Rs} \left( \frac{1}{\frac{1}{A} \left( \frac{Rf}{Rs} + 1 \right) + 1} \right) = -\frac{A}{2}, \quad (6)$$

where $Rf = (A + 1)Rs$, and $$Vout = -\frac{A}{2} (Vsn).$$

For the non-inverting input current noise Inp of amplifier 20:

The current source 73 and output impedance 15 can be represented by an equivalent Thevenin voltage source connected in series with resistor 15 and having a value equal to Inp×Rs. From the gain expression (6), $$Vout = -\frac{A}{2} (Inp\, Rs).$$

The total output noise power for the active impedance-matched video amplifier of FIG. 2 is the power sum of each of the noise expressions obtained by superposition. The noise factor F is then the total noise power divided by the output noise power of a noiseless amplifier with the same gain. Therefore, the total noise power for the video amplifier of FIG. 2 is:

$$Nout = \left[ \frac{A}{2} (Vsn) \right]^2 + \left[ Vn \left( \frac{1}{2} \right) \left( \frac{A(A + 2)}{A + 1} \right) \right]^2 +$$

$$\left[ \frac{A}{2} (Inp\, Rs) \right]^2 + \left[ Inn\, R2 \left( \frac{1}{2} \right) \left( \frac{(A + 2)(A - 1)}{A + 1} \right) \right]^2 +$$

$$\left[ Vn2 \left( \frac{1}{2} \right) \left( \frac{(A + 2)(A - 1)}{A + 1} \right) \right]^2 +$$

$$\left[Vn1\left(\tfrac{1}{2}\right)\left(\tfrac{A+2}{A+1}\right)\right]^2 + \left[Vnf\left(\tfrac{1}{2}\right)\tfrac{A}{A+1}\right]^2,$$

and the noise factor is:

$$F = 1 + \left[\left(\tfrac{Vn}{Vsn}\right)\left(\tfrac{A+2}{A+1}\right)\right]^2 + \left[\tfrac{Inp\,Rs}{Vsn}\right]^2 + \quad (7)$$

$$\left[\left(\tfrac{InnR2}{Vsn}\right)\left(\tfrac{(A+2)(A-1)}{A(A+1)}\right)\right]^2 +$$

$$\left[\left(\tfrac{Vn2}{Vsn}\right)\left(\tfrac{(A+2)(A-1)}{A(A+1)}\right)\right]^2 +$$

$$\left[\left(\tfrac{Vn1}{Vsn}\right)\left(\tfrac{A+2}{A(A+1)}\right)\right]^2 + \left[\left(\tfrac{Vnf}{Vsn}\right)\left(\tfrac{1}{A+1}\right)\right]^2.$$

Although the noise factor expression (7) calculated for the active impedance-matched video amplifier includes more noise terms than in each of the noise factor expressions (4) and (5) derived for the conventional resistively matched video amplifiers shown in FIG. 3 and FIG. 5, respectively, the first term in expression (7) is a 1, not a 2. Thus, if noiseless resistors and noiseless amplifiers are assumed, the noise figure for the active impedance-matched video amplifier of the present invention theoretically could be reduced to 0 dB. Of course, in practice, the effects of the noise sources must be considered. However, even when the noise sources are included in the analysis of the active impedance matching circuit of the present invention, the end result is a substantial reduction in the noise figure.

For purposes of the noise analysis above, inverter 22 was assumed to be noiseless. This assumption is reasonable because although a noiseless inverter cannot be realized, the gain preceding the inverter, as provided by the amplifier circuit associated with operational amplifier 20 in FIG. 2, would typically be high enough to render the effects of the inverter nominal for the noise analysis.

Figure 9:
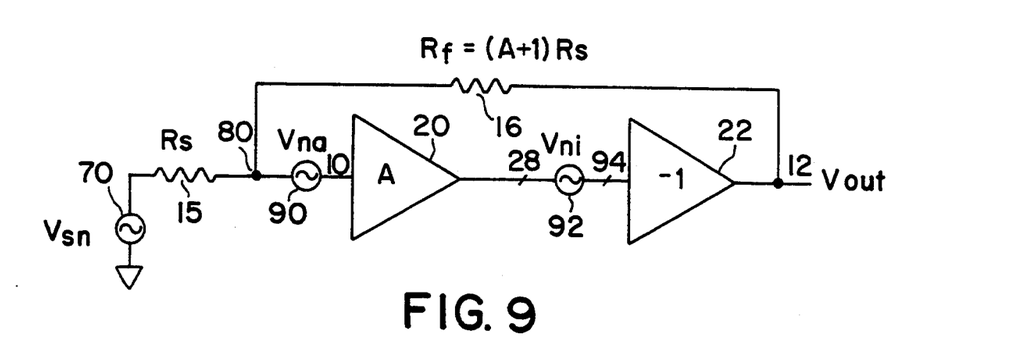
FIG. 9 is a second simplified circuit diagram for analysis of the circuit noise model of FIG. 7 by superposition.

To verify the above assumption, FIG. 9 is a simplified representation of the active impedance-matched video amplifier of FIG. 2, including a noise source 92 representing the noise contribution Vni of inverter 22. In FIG. 9, operational amplifier 20 is modeled as an amplifier having a single input 10 and a stage gain of A. Voltage source 90 represents the composite noise voltage Vna generated by amplifier 20. The potential at the input 10 of amplifier 20 is assumed to be V1, and the potentials at nodes 80, 28, and 94, are represented as V2, V3, and V4, respectively. By superposition, the noise outputs generated by the voltage noise Vna of amplifier 20 and the voltage noise Vni of inverter 22 are derived as follows:

For the noise voltage Vna of amplifier 20:

$$Vna = V1 - V2,$$

$$V1 = Vout\left(\tfrac{Rs}{Rs + (A+1)Rs}\right) = \tfrac{Vout}{(A+2)},$$

$$V2 = -Vout\left(\tfrac{1}{A}\right) \quad \text{(with } Vni = 0\text{)},$$

$$Vna = \tfrac{Vout}{A+2} - \left(-\tfrac{Vout}{A}\right), \text{ and}$$

$$Vout = \tfrac{1}{2}\left(\tfrac{A(A+2)}{A+1}\right)Vna.$$

For the noise voltage Vni of inverter 22:

$$V3 = \left(\tfrac{A}{A+2}\right)Vout \quad \text{(with } Vna = 0\text{)},$$

$$V4 = -Vout$$

$$Vni = V3 - V4 = \left(\tfrac{A}{A+2}\right)Vout - (-Vout), \text{ and}$$

$$Vout = \tfrac{1}{2}\left(\tfrac{A+2}{A+1}\right)Vni.$$

A comparison of the output noise voltages generated by each of the amplifiers shows that the noise contribution of amplifier 20 is considerably larger than that of inverter 22. If the noise voltages associated with each amplifier were equivalent, the output noise contribution due to amplifier 20 would be larger than that of inverter 22 by a factor of A, the gain of the stage including amplifier 20. Therefore, if A is set to a reasonably high value, such as A=19, as in the example discussed with respect to FIG. 2, the effect of the noise contributed by inverter 22 is nominal.

For an example demonstrating the noise performance advantages of the present invention relative to the conventional video amplifiers, it is assumed that a commercially available operational amplifier, such as the AD9617, manufactured by Analog Devices, is used for amplifier 38 of the resistively matched voltage amplifier shown in FIG. 3. Matching resistor 33 is assumed to be 50Ω in accordance with the output impedance 15. Resistor 34 is selected to be 400Ω to provide maximum bandwidth, and, for a gain of 9.5, resistor 36 is 22.2Ω. Noise sources for the AD9617 used for amplifier 38 are assumed to generate 1.2 nV/root hertz voltage noise, and 35 picoamps/root hertz current noise at each input. The circuit noise model for this configuration corresponds to that shown in FIG. 4.

Using expression (4) for the circuit noise model of FIG. 4, it can be shown that the noise factor F=17.40 and the noise figure NF=12.41 dB. For example, when $Vn = 1.2 \ nV/Rt\ Hz$, $Rs = 50\Omega$, $R1 = 400\Omega$, $R2 = 22.2\Omega$, and $A = 1 + R1/R2 = 19$, $Vsn = (4kTBRs)^{0.5} = 0.895\ nV/Rt\ Hz$, $$Vn1 = (4kTBR1)^{0.5} = 2.53 \ nV/\sqrt{Hz}, \text{ and}$$

$$Vn2 = (4KTBR2)^{0.5} = 0.596 \ nV/\sqrt{Hz},$$

where T is Boltzman's constant and B is bandwidth.

A similar calculation can be made for the conventional transimpedance amplifier shown in FIG. 5, assuming the use of an AD9617 operational amplifier for amplifier 58. The matching resistor 53 is assumed to be 50Ω to match the output impedance 15. To provide the same through-put gain of 9.5 as the voltage amplifier of FIG. 3, the feedback resistor 56 must be 950ω. The circuit noise model for the transimpedance amplifier is shown in FIG. 5. Using the noise voltages Vsn, Vn1, and Vn2 calculated for the voltage amplifier of FIG. 3, and considering the additional noise voltage Vnf contributed by the 950Ω feedback resistor 56, equal to $$Vnf = (4kTBRf)^{0.5} = 3.90 \ nV/\sqrt{Hz},$$

it can be shown from expression (5) that the noise factor F=16.698, and that the noise figure NF=12.23 dB.

In comparison, the active impedance-matched video amplifier of the present invention offers a significant improvement in noise figure over the conventional video amplifiers shown in FIG. 3 and FIG. 5. For example, if an AD9617 operational amplifier is used for amplifier 20 in the video amplifier shown in FIG. 2, and the values of resistors 24 and 26 are selected to provide a gain of roughly 9.5 (the same gain as that of the conventional video amplifiers shown in FIG. 3 and FIG. 5), then the noise factor and noise figure can be calculated in accordance with equation (7), using the noise voltages Vsn, Vn1, Vn2, and Vnf calculated for the conventional video amplifiers shown in FIG. 3 and FIG. 5. If the noise contribution of the feedback resistor 16 is again assumed to be $$Vnf = (4kTBRf)^{0.5} = 3.90 \ nV/\sqrt{Hz},$$

then
F=8.287 and
noise figure=9.18 dB.

Thus, a noise figure improvement of more than 3 db is realized by the active impedance-matching video amplifier of the present invention in comparison with the conventional video amplifiers. Even if the AD9617 operational amplifier is used for inverter 22, an improvement of more than 3 dB is readily achievable.

Figure 10:
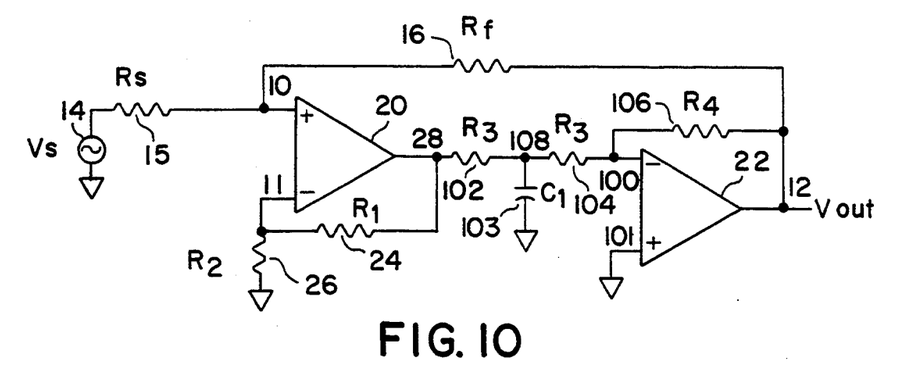
FIG. 10 is another embodiment of the active impedance-matched video amplifier of FIG. 2 incorporating a resistor-capacitor combination between amplifier stages to provide a dominant pole for stability.

FIG. 10 is another embodiment of the active impedance-matched video amplifier of the present invention, substantially corresponding to the video amplifier shown in FIG. 2. However, the amplifier circuit illustrated in FIG. 10 uses an inverting unity-gain operational amplifier to realize inverter 22 and adds a resistor-capacitor combination between amplifier 20 and inverter 22 to provide a dominant pole for stability.

As shown, the inverting input 100 of operational amplifier 22 is connected to the output 28 of operational amplifier 20 via resistors 102 and 104. The non-inverting input of operational amplifier 22 is connected to the ground potential. Resistor 106, connected between the video amplifier output 12 and the inverting input 100 of operational amplifier 22, and having a value R4, combines with resistors 102 and 104, each having values of R3=R4/2, to provide an inverting unity stage gain of −R4/2R3=−R4/R4=−1.

Like the video amplifier shown in FIG. 2, the FIG. 10 embodiment provides a significant improvement in noise figure. However, if operational amplifiers such as the AD9617 are used for both amplifier 20 and inverter 22, the circuit may become unstable because each of the AD9617 amplifiers within the loop has a pole at approximately 125 MHz. To stabilize the amplifier circuit, a dominant pole can be added by connecting capacitor 103 at the common node 108 between resistors 102, 104. The values of resistors 102, 104 and capacitor 103 can be selected to provide a pole at 10 MHz, for example. The resulting circuit is stable to at least 5 MHz. For operation at higher frequencies, other stabilization techniques will be apparent to one skilled in the art.

For an exemplary implementation of the active impedance-matched video amplifier shown in FIG. 10, resistor 26 has a value R2 equal to 22.2Ω, and resistor 24 has a value R1 of 400Ω. This provides a stable, finite stage gain for operational amplifier 20 of A=1+R1/R2=19. Resistor 106 has a value R4 of 400Ω and resistors 102 and 104 each have a value R3 of 200Ω. As a result, operational amplifier 22 provides a unity inverting gain of −R4/2R3=−1. To stabilize the circuit, capacitor 102 can be selected to have a value C1 equal to 80 pF to provide the necessary dominant pole. To provide an actively matched input impedance for the output impedance 15, having a value of Rs=50Ω, feedback resistor 16 has a value Rf of (A+1)Rs=1kΩ. Thus, the effective input impedance seen at input 10 is equal to Rf/(1+A)=50Ω.

Figure 11:
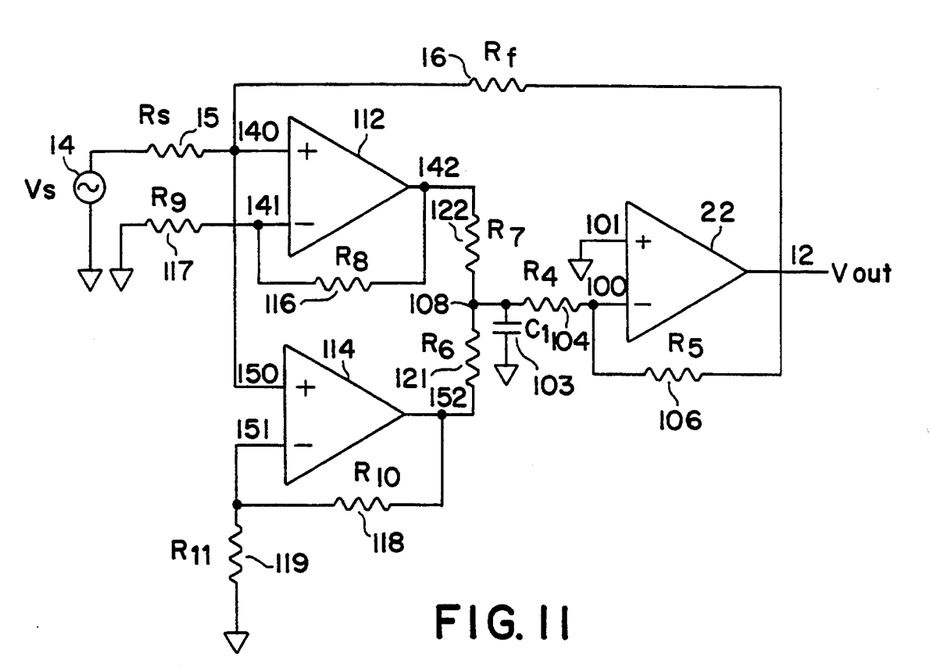
FIG. 11 illustrates an additional embodiment of the active impedance-matched video amplifier of the present invention, including a low noise parallel amplifier stage.

FIG. 11 illustrates another embodiment of the active impedance-matched video amplifier of the present invention. The essential difference in the video amplifier of FIG. 11, relative to that shown in FIG. 2, is that amplifier 20 is realized by a parallel amplifier configuration that provides additional advantages in noise performance. The parallel amplifier configuration provides a significant improvement in noise figure when used alone, as will be demonstrated below. When the parallel amplifier configuration is combined with the active impedance-matching concept, as shown in FIG. 11, the overall noise performance is further improved.

In FIG. 11, video signal generator 14 drives the non-inverting inputs 140, 150 of operational amplifiers 112 and 114, respectively, via output impedance 15. Each amplifier 112, 114 is constructed in a non-inverting configuration. For instance, resistor 116 connects the output 142 and the inverting input 141 of amplifier 112, and resistor 117 is connected between the inverting input 141 and the ground potential. Similarly, resistor 118 is connected between the output 152 and the inverting input 151 of amplifier 114, and resistor 119 connects the inverting input 151 to the ground potential.

The resistor values R8, R9, R10, and R11 for resistors 116, 117, 118, and 119, respectively, are selected such that each amplifier 112, 114 provides an identical stage gain of A=1+R8/R9=1+R10/R11. If R8 and R10 are each 400Ω and R9 and R11 are each 22.2Ω, the stage gain A=19. Resistor 122, having a value R7=400Ω, for example, connects the output 142 of amplifier 112 to output node 108. Resistor 121, also having a value R6=400Ω, connects the output 152 of parallel amplifier 114 to the output node 108. Output node 108 is connected via resistor 104 to the inverting input 100 of inverting operational amplifier 22. Resistor 104, having a value R4=200Ω, and resistor 106, having a value R5=400Ω, combine with resistors 121, 122 to provide an inverting unity stage gain.

Feedback resistor 16, having a value Rf=1kΩ, connects the output 12 of inverting operational amplifier 22 to the non-inverting inputs 140, 150 of parallel operational amplifiers 112, 114, respectively. As in the previous examples, feedback resistor 16 provides an active matching impedance at each non-inverting input 140, 150 for the 50Ω output impedance 15.

Figure 12:
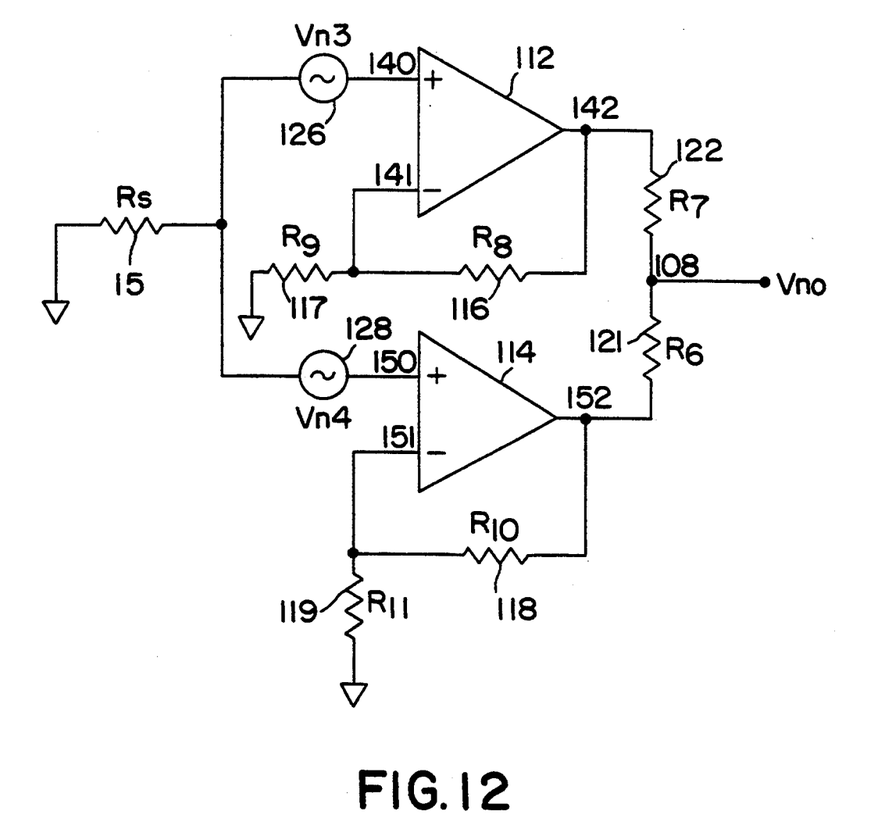
FIG. 12 is a circuit noise model for the low noise parallel amplifier stage shown in FIG. 11.

The following is an analysis of the noise advantages of the parallel non-inverting amplifier stage, comprising amplifiers 112 and 114, taken alone. FIG. 12 is a circuit noise model for the parallel amplifier stage shown in FIG. 11. In FIG. 12, voltage source 126 represents the noise voltage Vn3 generated by amplifier 112, and voltage source 128 represents the noise voltage Vn4 contributed by amplifier 114. Representing the potential at output 142 as Vo3 and the potential at output 152 as Vo4, by superposition, the potential V1 at node 108 is:

$$V1 = Vo3\left(\frac{R6}{R6+R7}\right) + Vo4\left(\frac{R7}{R6+R7}\right)$$

Because R6=R7 and Vo3=Vo4, however, the equation can be reduced to:

$$V1 = Vo3(\tfrac{1}{2}) + Vo4(\tfrac{1}{2}) = Vo3(\tfrac{1}{2}) + Vo3(\tfrac{1}{2}) = Vo3$$

If the noise generated by each amplifier 112, 114 is a noise voltage Vn3, Vn4, respectively, the individual noise outputs Vno3, Vno4 of the amplifiers at node 108 are:

$$Vno3 = Vn3\ (A3),\ \text{where}\ A3 = 1 + \frac{R8}{R9},\ \text{and}$$

$$Vno4 = Vn4\ (A4) = Vn4\ (A3).$$

Thus, the total output noise voltage Vno at node 108 is $$Vno = \frac{R6}{R6+R7}(Vno3) + \frac{R7}{R6+R7}(Vno4) = \tfrac{1}{2} Vno3 + \tfrac{1}{2} Vno4$$

Because the output noise generated by the amplifiers 112, 114 is uncorrelated, however, Vno3 is not actually equal to Vno4. Uncorrelated noise adds as power, not voltage. Thus, the output noise voltage Vno at node 108 is:

$$Vno = \sqrt{\left(\tfrac{1}{2} Vno3\right)^2 + \left(\tfrac{1}{2} Vno4\right)^2} = \tfrac{1}{2}\sqrt{(Vno3)^2 + (Vno4)^2}$$

However, because $|Vno3| \models |Vno4|$, $(Vno3)^2 = (Vno4)^2 = (Vno)^2$.

Therefore, $$\text{noise output} = Vno = \tfrac{1}{2}\sqrt{2(Vno)^2} = \tfrac{\sqrt{2}}{2} Vno = \tfrac{\sqrt{2}}{2} Vno3.$$

The output signal-to-noise ratio of the parallel amplifier configuration is then $$S/N = \frac{Vo3}{\left(\frac{\sqrt{2}}{2} Vno3\right)} = \sqrt{2}\ \frac{Vo3}{Vno3}.$$

For a single amplifier, the signal-to-noise ratio would be:

$$S/N = \frac{Vo3}{Vno3}.$$

By comparison, it can be seen that the parallel amplifier configuration improves the signal-to-noise ratio by a factor of $\sqrt{2}$, relative to the single amplifier.

Using the parallel amplifier stage 112, 114, in conjunction with active impedance-matching, the embodiment of the present invention illustrated in FIG. 11 realizes a video amplifier that combines the noise advantages of the parallel amplifier configuration, demonstrated above, with those shown for the video amplifier of FIG. 2, providing an active impedance-matched video amplifier exhibiting superior noise characteristics.

Having described the presently preferred embodiments of the invention, additional advantages and modifications will readily occur to those skilled in the art from consideration of the specification and practice of the invention disclosed herein. It is intended that the specification and examples be considered as exemplary only, with a true scope and spirit of the invention being indicated by the following claims.

I claim:

1. A low noise active impedance-matched video amplifier, comprising:
    a video signal generator;
    an amplifier including a first input coupled to an output of said video signal generator, said amplifier having an input impedance greater than an output impedance of said video signal generator;
    first feedback means, coupled between an output and a second input of said amplifier, for reducing the open-loop gain of said amplifier; and
    second feedback means, coupled between said output and said first input of said amplifier, for reducing an effective input impedance of said amplifier to a value substantially equivalent to the value of said output impedance of said video signal generator.

2. The low noise active impedance-matched video amplifier of claim 1, wherein said second feedback means includes a feedback resistor coupled between said output and said first input of said amplifier.

3. The low noise active impedance-matched video amplifier of claim 2, wherein said amplifier includes an operational amplifier, said first input of said amplifier being the non-inverting input of said operational amplifier, and said second input of said amplifier being the inverting input of said operational amplifier.

4. A low noise active impedance-matched video amplifier, comprising:
    a video signal generator;
    an amplifier including a first input coupled to an output of said video signal generator, said amplifier having an input impedance greater than an output impedance of said video signal generator;
    first feedback means, coupled between an output and a second input of said amplifier, said first feedback means reducing said open loop gain of said amplifier to a value A and said output impedance of said video signal generator has a value Rs, said feedback resistor having a resistance value substantially equivalent to $(1+A) \times Rs$;

second feedback means, including a feedback resistor, coupled between said output and said first input of said amplifier, for reducing an effective input impedance of said amplifier to a value substantially equivalent to the value of said output impedance of said video signal generator.

5. A low noise active impedance-matched video amplifier comprising:

a video signal generator;

an amplifier including a first input coupled to an output of said video signal generator, said amplifier having an input impedance greater than an output impedance of said video signal generator;

second feedback means, coupled between an output and a second input of said amplifier for reducing the open loop gain of said amplifier;

second feedback means, including a feedback resistor, coupled between said output and said first input of said amplifier, for reducing an effective input impedance of said amplifier to a value substantially equivalent to the value of said output impedance of said video signal generator, wherein said first feedback means includes a first resistor coupled between said output of said amplifier and said second input of said amplifier and a second resistor connected between said second input and a ground potential, and wherein said amplifier includes an operational amplifier, said first input of said amplifier being the non-inverting input of said operational amplifier, and said second input of said amplifier being the inverting input of said operational amplifier.

6. The low noise active impedance-matched video amplifier of claim 5, wherein said second feedback means includes an inverting amplifier having an input coupled to said output of said amplifier and an output coupled to said feedback resistor.

7. The low noise active impedance-matched amplifier of claim 6, wherein said inverting amplifier includes a second operational amplifier, said second operational amplifier.

8. A low noise active impedance-matched video amplifier comprising:

a video signal generator;

an amplifier including a first input coupled to an output of said video signal generator, said amplifier having an input impedance greater than an output impedance of said video signal generator;

first feedback means, coupled between an output and a second input of said amplifier for reducing the open loop gain of said amplifier;

second feedback means, coupled between said output and said first input of said amplifier, for reducing an effective input impedance of said amplifier to a value substantially equivalent to the value of said output impedance of said video signal generator, wherein said amplifier includes first and second amplifiers, each of said first and second amplifiers having a first input commonly coupled to said output of said video signal generator.

9. The low noise active impedance-matched video amplifier of claim 8, wherein said second feedback means includes a feedback resistor coupled between the commonly connected first inputs of said first and second amplifiers and respective outputs of said first and second amplifiers.

10. The low noise active impedance-matched video amplifier of claim 9, wherein said first feedback means reduces the open loop gains of said first and second amplifiers to a value A and said output impedance of said video signal generator has a resistance value Rs, said feedback resistor having a resistance value substantially equivalent to $(1+A) \times Rs$.

11. The low noise active impedance-matched video amplifier of claim 9, wherein said first amplifier includes a first operational amplifier, said first input of said first amplifier being the non-inverting input of said first operational amplifier and a second input of said first amplifier being the inverting input of said first operational amplifier, and wherein said second amplifier includes a second operational amplifier, said first input of said second amplifier being the non-inverting input of said second operational amplifier and a second input of said second amplifier being the inverting input of said second operational amplifier.

12. The low noise active impedance-matched video amplifier of claim 11, wherein said first feedback means includes a first resistor connected between an output and said second input of said first operational amplifier, a second resistor connected between said second input of said first operational amplifier and a ground potential, a third resistor connected between an output and said second input of said second operational amplifier, and a fourth resistor connected between said second input of said second operational amplifier and a reference potential.

13. The low noise active impedance-matched video amplifier of claim 12, wherein said second feedback means includes an inverting amplifier having an input coupled to said outputs of said first and second amplifiers and an output coupled to said feedback resistor.

14. The low noise impedance-matched video amplifier of claim 13, wherein said inverting amplifier includes a third operational amplifier, the input of said inverting amplifier being the inverting input of said third operational amplifier.

* * * * *